United States Patent [19]

Scire

[11] Patent Number: 4,506,154
[45] Date of Patent: Mar. 19, 1985

[54] PLANAR BIAXIAL MICROPOSITIONING STAGE

[76] Inventor: Fredric E. Scire, 5319 Wye Creek Dr., Frederick, Md. 21701

[21] Appl. No.: 436,055

[22] Filed: Oct. 22, 1982

[51] Int. Cl.³ ............................................... G21K 5/10
[52] U.S. Cl. .................................. 250/442.1; 310/328; 269/58; 269/71
[58] Field of Search ................. 250/442.1; 269/58, 71, 269/73; 29/740, 760; 310/328; 219/121 E

[56] References Cited

U.S. PATENT DOCUMENTS

| | | |
|---|---|---|
| 3,257,704 | 6/1966 | Hafner et al. |
| 3,365,633 | 5/1965 | Anderson et al. |
| 3,551,764 | 12/1970 | Evans |
| 3,678,270 | 7/1972 | Braun ................................ 250/442.1 |
| 3,684,904 | 8/1972 | Gadutva et al. ................... 250/442.1 |
| 3,790,155 | 2/1974 | Longamore ........................ 250/442.1 |
| 3,835,338 | 9/1974 | Martin |
| 3,902,084 | 8/1975 | May, Jr. |
| 3,903,435 | 9/1975 | Bouygues et al. |
| 3,952,215 | 4/1976 | Sakitani |
| 4,163,168 | 7/1979 | Ishikawa et al. ...................... 310/328 |
| 4,190,785 | 2/1980 | Kompanek |
| 4,240,004 | 12/1980 | Coleman |

OTHER PUBLICATIONS

Fredric E. Scire and E. Clayton Teague, Rev. Sci. Instrum., 49 (12), Dec. 1978, "Piezodriven 50-μm range stage with subnanometer resolution".
Single Page Description of the Two-Dimensional Piezoelectric Micropositioning Stage, Rev. Sci. Instrum.

*Primary Examiner*—Bruce C. Anderson
*Attorney, Agent, or Firm*—James J. Brown

[57] ABSTRACT

A micropositioning stage is described which may be monolithic and which comprises a first structure which is mounted coplanar with and concentrically within a second structure. Both structures consist essentially of frames and pivoting lever arms which respond to linear force from piezoelectric transducers to move an object mounted on a platform in two different directions one of which may be at right angles to the other. The invention is particularly characterized by permitting biaxial movement of an object in a planar, essentially flat unit. In one embodiment, the present invention is monolithic in the sense that it is a single unitary structure except for the piezoelectric transducer elements.

12 Claims, 2 Drawing Figures

PLANAR BIAXIAL MICROPOSITIONING STAGE

SUMMARY OF THE INVENTION

The present invention is directed to a micropositioning stage for independent biaxial movement of an object in a single plane. More specifically, the present invention is directed to a piezo-amplified biaxial flexure stage which may be monolithic and combines a pair of piezo electric transducers and a precise arrangement of flexure pivots and lever arms to permit movement of the object in a precise, controlled pattern in a determined two axis single plane.

BACKGROUND OF THE INVENTION

The accurate measurement of microscopic objects whose sizes are in the range of one to fifty $\mu m$ requires that the object be moved slowly under a reference line or an extremely fine cross air in the measuring instrument. Displacements of the object are usually measured with the use of an interferometer, an encoder or a linear variable differential transformer. In order to be useful, the stage on which the object is placed must be capable of linearly positioning objects over the required range with resolutions of 0.001 $\mu m$ or less and with a motion that is as free as possible of vibration, pitch, roll and yaw. In addition, the stage's design should allow the stage to be remotely activated and thus capable of being isolated from external vibrations and other environmental disturbances.

Devices of the prior art which have been used for micropositioning stages have frequently employed mechanical bearings and screws to permit the required movement of the object being studied. Such devices have however suffered from problems of screw backlash and the need for lubricants which can present problems when cryogenic temperatures or vacuums required for electron microscopy are used.

In addition, systems of the prior art for micropositioning objects where movement of the object along two axial directions is contemplated have involved the stacking of one stage of top of the other in a vertical arrangement. This procedure, while permitting biaxial orientation and displacement of the object also results in deviation in accordance with the "Abbe" principle which has been summarized in the statement:

"The placement measuring system should be in line with the functional point whose displacement is to be measured. If this is not possible, either the slideways that transfer the displacement must be free of angular motion or angular motion data must be used to calculate the consequences of the offset." J. B. Bryan, "The Abbe Principle Revisited—An Updated Interpretation", Lawrence Livermore Laboratory, May 14, 1979.

Accordingly, it is an object of the present invention to provide a monolithic micropositioning stage for biaxial movement of an object which avoids the above-noted problems associated with using screw drives, lubricants and bearings.

It is a further object of the present invention to provide a micropositioning device which allows biaxial movement of the object being studied in a single plane.

Yet a further object of the present invention is to provide a micropositioning device for movement of the objective in two directions which avoids the "Abbe" deviation heretofore encountered in systems where multiple stages are stacked vertically upon one another.

Yet a further object of the present invention is to provide a micropositioning system which avoids the need for sliding or rolling of members and which require lubrication and may produce friction and bearing noise.

Still another object of the invention is to provide a fast, electrically controlled response time for linear movement of the object which is proportional to applied voltage.

DETAILED DESCRIPTION OF THE INVENTION

Figure 1:
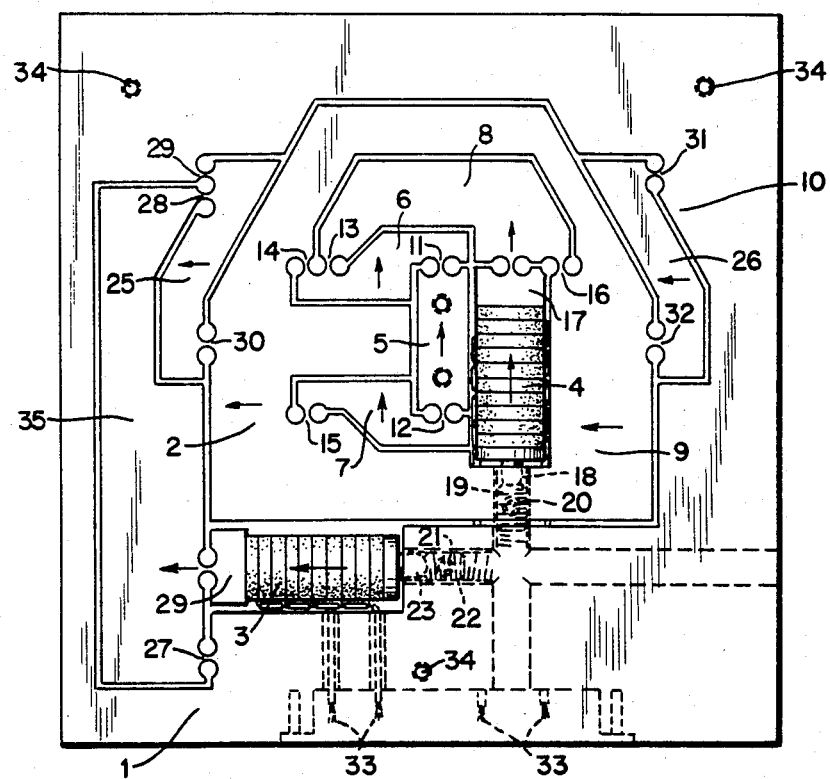
FIG. 1 is a top plan view of the micropositioning stage of the present invention.

The above and other objects of the present invention are achieved by providing a monolithic micropositioning stage for biaxial movement of an object in a single plane. The micropositioning stage of the invention utilizes a combination of a pair of piezoelectric transducers together with an arrangement of flexure pivots and lever arms to produce bidirectional movement in a single plane. In accordance with the invention two structures are provided one of which is mounted coplanar with and concentrically within the second. The central or first structure which is mounted within the second structure essentially consists of a generally flat central platform for holding the object which is to be moved. This central platform is mounted within a structural frame between the ends of two opposing generally parallel pivot arms. The other end of each of the pivot arms is attached to the structural frame and one of the pivot arms also engages a third pivot arm at a point proximate to the first pivot arm's attachment with the structural frame. The third pivot arm itself is pivotally attached to the structural frame also at the end remote from the point at which it is attached to the first pivot arm. A piezoelectric transducer element is disposed within the structural frame in a position to exert linear force in one direction against the third pivot arm at a point proximate to its pivotal attachment with the frame. This force against the third pivot arm causes displacement of that pivot arm as well as the other two pivot arms and the platform on which the object is mounted. The extent of linear displacement of the platform and object are proportional to the voltage supplied to the piezoelectric element and is in the same direction as the force exerted by the piezoelectric element on the third pivot arm.

The entire first structure including the central platform and three pivot arms and first piezoelectric element are all enclosed and coplanar with a second structure which produces linear displacement of the mounted object in a second direction which is at right angles to the first direction. This second structure comprises a structural frame and three additional pivot arms. The first two of these three additional pivot arms are generally parallel and each is pivotally attached at one end to the second frame with its other end in engagement with an opposing side of the first structure. Thus, displacement of these two opposing parallel pivot arms causes a linear displacement of the first structure in the second direction which is at right angles to the first direction of displacement. One of these two pivot arms also engages the third additional pivot arm at a point proximate to the pivotal attachment of that pivot arm to the frame. The other end of the additional third pivot arm is itself pivotally attached to the frame also and proximate to that attachment is in engagement with a second piezoelectric transducer for producing a linear force against the third pivot arm. This linear force is in response also to applied electric voltage and causes displacement of the three additional pivot arms as well as the centrally mounted first structure which engages two of the pivot arms in the linear direction which is different from the first direction of displacement and, typically, at right angles.

The micropositioning stage of the present invention will however be more fully appreciated by having reference in detail to the attached drawings.

DETAILED DESCRIPTION OF THE DRAWINGS

Directing attention to FIG. 1 of the drawings, a first planar structure 1 is shown which is coplanar with and generally surrounds structure 2 which is mounted concentrically within structure 1. Generally central to structure 2 is platform 5 upon which the object (not shown) is mounted. Two sets of stacked piezoelectric transducer elements are shown respectively at 3 and 4 mounted within structures 1 and 2. Looking first at the centrally mounted second structure 2, a first pivotally mounted lever arm 6 is disposed generally in parallel with a similar second pivotally mounted lever arm 7. These two lever arms are pivotally attached at 14 and 15 to the frame 9 which surrounds the entire structure. At the other ends of the two lever arms 6 and 7 the platform 5 is engaged at opposite ends 11 and 12 so that movement of the lever arms 6 and 7 in the direction indicated by the arrow produces a similar movement by the platform. At 13 a third lever arm 8 engages at one end the first lever arm 6 and at its other end 16 is pivotally attached to the frame 9. The lever arm 8 further engages the piezoelectric stack 4 through plate 17 proximate to the pivot point 16. Thus, in response to applied electric current the piezoelectric stack 4 is displaced in the direction of the arrow against the plate 17 and pivot arm 8. This displacement in turn is translated to the lever arm 6 to produce a corresponding displacement in the central platform 5 and the parallel lever arm 7.

Directing attention now to structure 1 which essentially surrounds structure 2 and is coplanar therewith, two additional pivotally mounted lever arms 25 and 26 are provided and are pivotally attached to the frame 10 at points 31 and 29. The lever arm 25 is further connected with the frame 9 of structure 2 at 30 and the lever arm 26 has a similar attachment with the frame 9 at 32. Lever arm 25 is however also connected at 28 with a third additional lever arm 35 which is pivotally attached to the frame 10 at 27. A second set of stacked piezoelectric transducers 3 is mounted within a cavity in the frame 10 and, in response to applied electric current, produces a displacement in the direction of the arrow against plate 24 and the end of lever arm 35 proximate to the point of attachment 27. This displacement in turn results in a displacement in the same direction of lever arm 25 and 26 and the entire structure 2 to which these two lever arms are connected. It will be noted in this regard that except for the points 30 and 32, the structure 2 essentially floats free within structure 1.

The stacked piezoelectric transducers 3 and 4 are both mounted within cavities formed in the respective structures 1 and 2. Proper positioning and tensioning of these piezoelectric stacks can be achieved by means of force screws 19 and 21 which are respectively held in place by lock screws 22 and 20. Back plates 23 and 18 are provided on one end with a curvature which together with the radius of the force screw allow the end of the piezoelectric stack to align itself to the flat face of the monolith.

Electrically conductive wires 33 provide power to the respective piezo stacks 3 and 4. Feet 35 are provided on the underside of the unit to provide kinematic support.

Figure 2:
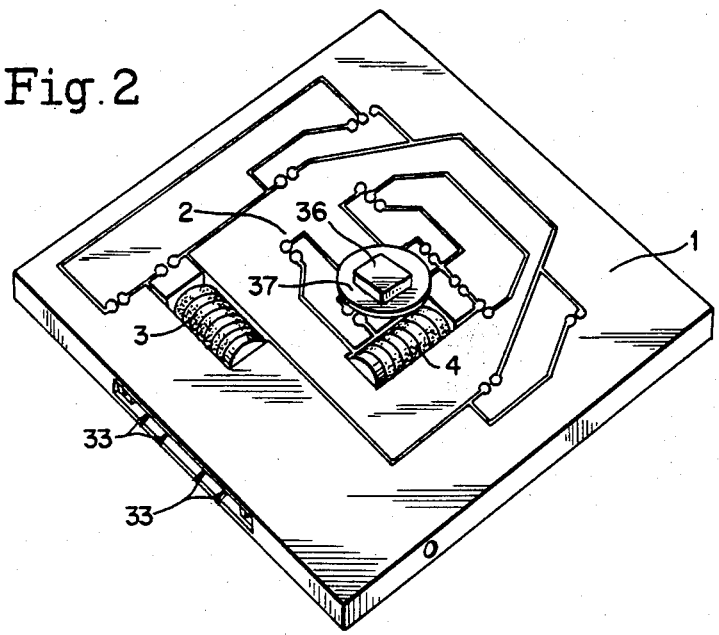
FIG. 2 is a perspective view of the micropositioning stage of the present invention.

FIG. 2 of the drawings illustrates a perspective view of the present invention with an object or specimen 36 shown resting on the circular platform 37. The two piezoelectric transducer stacks 3 and 4 are shown in the respective structures 1 and 2. Pairs of wire leads 33 enter the unit from the side to provide the necessary electric power to the transducer stacks. From FIG. 2 of the drawings it will particularly be noted that the device of the present invention is planar in configuration and that the top surface of the micropositioning stage is essentially flush except for the object 36 mounted on the platform 37.

Although the piezoelectric transducer stacks employed in accordance with the present invention can be assembled using known procedures of soldering or bonding with a conductive adhesive such as epoxy resin, this prior procedure for forming the stack of piezo elements can be eliminated in accordance with the present invention. By using the compressive load adjustment screw of the instrument cavity of the present invention a loose stack of piezoelectric elements can be sufficiently loaded to insure their proper operation. Slots ground into the disc surfaces for attachment of electrical leads can be prealigned for insertion of wires with silver doped epoxy after the stack is loaded into the instrument cavity. Alignment of the stack can be facilitated by using a simple sleeve having a cut away portion whose inside diameter is slightly smaller than the outside diameter of the piezoelectric discs. Essentially this sleeve has a 90 degree quadrant removed and the edges of the quadrant are used to align the slots of each piezo disc as it is loaded into the tube. The negative poles of the disc are aligned on one edge and the positive poles aligned on the other edge of the cutaway quadrant. Once the fixture and stack are positioned in the instrument the load screw is tightened to lock to stack in place and the sleeve used for alignment purposes then is simply removed and the conductive wires inserted.

Still a further advantage of the present invention is the amplification of small displacement achievable by the micropositioning stage of the present invention.

Further description of the piezoelectric discs and their fabrication are described in Scire and Teague "Piezodriven 50-$\mu$m range Stage with Subnanometer Resolution" Rev. Sci. Instrum. 49(12) Dec. 1978, the substance of which is incorporated herein by reference.

The present invention has the advantage of minimizing problems encountered using designs of the prior art which involve lead screws, hydraulic reducers and differential screws. The present invention is further unique in permitting biaxial single plane without requiring stacked multiple control surfaces with the resultant likelihood of deviations occurring.

What is claimed is:

1. A micropositioning stage comprising a first structure mounted coplanar with and concentrically within a second structure, said first structure comprising a first frame and within said first frame platform means for holding a specimen and moving it in a linear first direction, said platform means being mounted between two arm means each pivotally attached to said first frame for causing said movement in response to displacement of one of said arm means by a third pivotal arm means also pivotally attached to said first frame for producing said displacement in response to initial displacement by first means for producing a linear force thereon in said first direction; said second structure comprising a second frame enclosing the first structure and two additional pivot arm means each pivotally attached to said second frame on either side of said first structure for causing movement thereof in a second direction relative to the first direction and in response to displacement of one of said additional pivot arm means by an additional third pivot arm means also pivotally attached to said second frame for producing said displacement in response to initial displacement by second means for porducing a linear force in said second direction.

2. A monolithic micropositioning stage for biaxial movement of an object in a single plane comprising a first structure for linear displacement of said object in a first direction and consisting essentially of a central platform for holding the object mounted within a planar structural frame between the ends of first and second opposing, generally parallel pivot arms, the other ends of which each respectively pivotally attach to said structural frame; the first of said pivot arms also engaging a third pivot arm at a point proximate to said pivotal attachment with the structural frame, said third pivot arm being pivotally attached to the structural frame at its end remote from the engagement with the first pivot arm; means for exerting a linear force in said first direction against said third arm proximate to its pivotal attachment with said frame, mounted in said frame whereby to cause displacement of said first, second and third pivot arms around their respective points of pivotal attachment to the frame and thereby to displace said platform in said first direction; and a second structure coplanar with and enclosing said first structure for linear displacement of said object in a second direction relative to said first direction and comprising a second structural frame, and fourth and fifth opposing, generally parallel pivot arms each pivotally attached at one end to and mounted within said second frame, each arm having its other end in engagement with an opposing side of said first structure whereby to cause linear displacement thereof in said second direction, said fourth pivot arm also engaging at a point proximate to its pivotal attachment to said second frame one end of a sixth pivot arm which is pivotally attached at its other end to said second frame, and, proximate to said pivotal attachment, is in engagement with further means mounted in said second frame for exerting a linear force in said second direction against said sixth pivot arm, whereby to cause displacement of said fourth, fifth and sixth pivot arms around their respective points of pivotal attachment thereby to displace said first structure and said object in said second direction.

3. The microposition stage of claim 1 wherein both of said means for producing linear force are piezoelectric transducers.

4. The microposition stage of claim 2 wherein both of said means for producing linear force are piezoelectric transducers.

5. The micropositioning stage of claim 1 which is monolithic.

6. The micropositioning stage of claim 2 which is monolithic.

7. The micropositioning stage of claim 1 in which said first and second directions are at right angles to one another.

8. The micropositioning stage of claim 2 in which said first and second directions are at right angles to one another.

9. The micropositioning stage of claim 1 wherein the pivotal attachments are flexure pivots.

10. The micropositioning stage of claim 2 wherein the pivotal attachments are flexure pivots.

11. The micropositioning stage of claim 3 wherein each of said piezoelectric transducers is a stack of mechanically mounted piezoelectric elements.

12. The micropositioning stage of claim 4 wherein each of said piezoelectric transducers is a stack of mechanically mounted piezoelectric elements.

* * * * *